(12) United States Patent
Kim et al.

(10) Patent No.: US 11,778,885 B2
(45) Date of Patent: Oct. 3, 2023

(54) DISPLAY APPARATUS COMPRISING DUMMY COLOR FILTER AND DUMMY COLOR CONVERSION PATTERN

(71) Applicant: SAMSUNG DISPLAY CO., LTD., Yongin-si (KR)

(72) Inventors: Jangil Kim, Yongin-si (KR); Jonghoon Kim, Yongin-si (KR); Myoungjong Lee, Yongin-si (KR); Seongyeon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 347 days.

(21) Appl. No.: 17/113,733

(22) Filed: Dec. 7, 2020

(65) Prior Publication Data
US 2021/0202587 A1  Jul. 1, 2021

(30) Foreign Application Priority Data

Dec. 30, 2019 (KR) .................. 10-2019-0178147

(51) Int. Cl.
*H10K 59/38* (2023.01)
*H10K 50/115* (2023.01)
*H10K 50/844* (2023.01)
*H10K 50/854* (2023.01)
*H10K 59/88* (2023.01)

(52) U.S. Cl.
CPC .......... *H10K 59/38* (2023.02); *H10K 50/115* (2023.02); *H10K 50/844* (2023.02); *H10K 50/854* (2023.02); *H10K 59/88* (2023.02)

(58) Field of Classification Search
None
See application file for complete search history.

(56) References Cited

U.S. PATENT DOCUMENTS

| | | | |
|---|---|---|---|
| 10,205,129 B2 | 2/2019 | Xu | |
| 10,249,689 B2 | 4/2019 | Kim et al. | |
| 2010/0219429 A1* | 9/2010 | Cok | H01L 51/5284 257/89 |
| 2017/0076678 A1* | 3/2017 | Lee | G02F 1/1336 |
| 2018/0059485 A1* | 3/2018 | Nam | G02F 1/133602 |
| 2019/0162993 A1* | 5/2019 | Hong | G02F 1/1339 |
| 2019/0304346 A1 | 10/2019 | Choi | |
| 2020/0326586 A1 | 10/2020 | Kim et al. | |
| 2021/0028236 A1* | 1/2021 | Kim | H10K 59/126 |

FOREIGN PATENT DOCUMENTS

| KR | 1020180002933 | 1/2018 |
|---|---|---|
| KR | 1020190052112 | 5/2019 |
| KR | 1020200120793 | 10/2020 |

* cited by examiner

*Primary Examiner* — Nduka E Ojeh
(74) *Attorney, Agent, or Firm* — F. CHAU & ASSOCIATES, LLC

(57) ABSTRACT

A display apparatus includes: a first substrate that includes a display area that includes a plurality of pixels and a non-display area around the display area; a second substrate that faces the first substrate; a color conversion layer disposed on the second substrate and that corresponds to the display area; a color filter layer disposed between the second substrate and the color conversion layer; a dummy color conversion pattern disposed on the second substrate and that corresponds to the non-display area and that includes a same material as a portion of the color conversion layer; and a dummy color filter disposed between the second substrate and the dummy color conversion pattern.

19 Claims, 10 Drawing Sheets

DISPLAY APPARATUS COMPRISING DUMMY COLOR FILTER AND DUMMY COLOR CONVERSION PATTERN

CROSS-REFERENCE TO RELATED APPLICATION

This application claims priority under 35 U.S.C. § 119 from, and the benefit of, Korean Patent Application No. 10-2019-0178147, filed on Dec. 30, 2019 in the Korean Intellectual Property Office, the contents of which are herein incorporated by reference in their entirety.

BACKGROUND

1. Technical Field

One or more embodiments are directed to a display apparatus, and more particularly, to a display apparatus with improved product reliability.

2. Discussion of Related Art

Display apparatuses, which visually displaying data, have been utilized in various fields for various purposes.

As display apparatuses have many uses, research has been conducted to improve the quality of display apparatuses. In particular, with the trend toward high-resolution display apparatuses, research has been conducted on improving color reproducibility of display apparatuses. Recently, as display apparatuses that include color conversion materials that contain quantum dots have been developed, display apparatuses with improved light efficiency and color reproducibility are being provided.

However, light may be emitted by a dummy pattern in a non-display area.

SUMMARY

One or more embodiments of the present disclosure provide a display apparatus with improved light efficiency and color reproducibility. However, these objectives are merely examples, and the scope of embodiments of the present disclosure is not limited thereby.

According to one or more embodiments, a display apparatus includes: a first substrate that includes a display area that includes a plurality of pixels and a non-display area around the display area; a second substrate that faces the first substrate; a color conversion layer disposed on the second substrate and that corresponds to the display area; a color filter layer disposed between the second substrate and the color conversion layer; a dummy color conversion pattern disposed on the second substrate and that corresponds to the non-display area, and that includes a same material as a portion of the color conversion layer; and a dummy color filter disposed between the second substrate and the dummy color conversion pattern.

The plurality of pixels may include a first pixel, a second pixel, and a third pixel, and the color conversion layer may include: a first color conversion pattern that corresponds to the first pixel; a second color conversion pattern that corresponds to the second pixel; and a light transmission pattern that corresponds to the third pixel, wherein the first color conversion pattern, the second color conversion pattern, the light transmission pattern, and the dummy color conversion pattern may be spaced apart from each other.

The first color conversion pattern may include first quantum dots that convert incident light into first color light, the second color conversion pattern may include second quantum dots that convert incident light into second color light, and the light transmission pattern may include light-scattering particles that scatter incident light.

The dummy color conversion pattern may include a same material as the first color conversion pattern or the second color conversion pattern. The dummy color filter may transmit light of a color different from that of light emitted from the dummy color conversion pattern.

The display apparatus may further include a first partition disposed between the first color conversion pattern and the second color conversion pattern, between the second color conversion pattern and the light transmission pattern, between the light transmission pattern and the dummy color conversion pattern, and in the non-display area.

The display apparatus may further include a second partition disposed on the first partition.

The color filter layer may include: a first color filter disposed between the second substrate and the first color conversion pattern and that selectively transmits first color light; a second color filter disposed between the second substrate and the second color conversion pattern and that selectively transmits second color light; and a third color filter disposed between the second substrate and the light transmission pattern and that selectively transmits third color light.

The dummy color filter may include a same material as the first color filter or the second color filter.

The first color filter, the second color filter, and the third color filter may be directly disposed on the second substrate.

The display apparatus may further include a light-shielding member disposed between the second substrate and the first color filter, the second color filter, the light transmission pattern and the dummy color filter. The light-shielding member may include a same material as the third color filter.

The display apparatus may further include a first inorganic insulating layer that extends between the first color filter and the first color conversion pattern, between the second color filter and the second color conversion pattern, and between the third color filter and the light transmission pattern.

According to one or more embodiments, a display apparatus includes: a first substrate includes a display area and a non-display area around the display area, where the display area includes a first pixel, a second pixel, and a third pixel; a second substrate that faces the first substrate; a first color conversion pattern disposed on the second substrate and that corresponds to the first pixel; a second color conversion pattern disposed on the second substrate and that corresponds to the second pixel; a light transmission pattern disposed on the second substrate and that corresponds to the third pixel; a dummy color conversion pattern disposed on the second substrate and that corresponds to the non-display area and includes a same material as the first color conversion pattern or the second color conversion pattern; a first color filter disposed between the second substrate and the first color conversion pattern, a second color filter disposed between the second substrate and the second color conversion pattern, and a third color filter disposed between the second substrate and the light transmission pattern; and a dummy color filter between the second substrate and the dummy color conversion pattern.

The first color conversion pattern, the second color conversion pattern, the light transmission pattern, and the dummy color conversion pattern may be spaced apart from each other.

The first color conversion pattern may include first quantum dots that convert incident light into first color light, the second color conversion pattern may include second quantum dots that convert incident light into second color light, and the light transmission pattern may include light-scattering particles that scatter incident light.

The dummy color filter may transmit different color light from that emitted from the dummy color conversion pattern.

When the dummy color conversion pattern includes the same material as the first color conversion pattern, the dummy color filter may include a same material as the second color filter, and when the dummy color conversion pattern includes the same material as the second color conversion pattern, the dummy color filter may include a same material as the first color filter.

The display apparatus may further include: a first display element disposed on the first substrate and that corresponds to the first pixel; a second display element disposed on the first substrate and that corresponds to the second pixel; and a third display element disposed on the first substrate and that corresponds to the third pixel.

The display apparatus may further include a thin-film encapsulation layer that covers the first display element, the second display element, and the third display element, and that includes at least one inorganic encapsulation layer and at least one organic encapsulation layer, and the first color conversion pattern, the second color conversion pattern, and the light transmission pattern may be disposed on the thin-film encapsulation layer.

According to one or more embodiments, a display apparatus includes: a first substrate that includes a display area that includes a plurality of pixels and a non-display area around the display area; a second substrate that faces the first substrate; a color conversion layer disposed on the second substrate and that corresponds to the display area and that includes a plurality of color conversion patterns; a dummy color conversion pattern disposed on the second substrate and that corresponds to the non-display area; and a dummy color filter disposed between the second substrate and the dummy color conversion pattern. The dummy color conversion pattern includes a same material as one of the plurality of color conversion patterns, and the dummy color filter transmits a different color light from the light emitted from the dummy color conversion pattern.

The display apparatus may further include a color filter layer disposed between the second substrate and the color conversion layer. The plurality of pixels may include a first pixel, a second pixel, and a third pixel. The plurality of color conversion patterns may include a first color conversion pattern that corresponds to the first pixel, a second color conversion pattern that corresponds to the second pixel, and a light transmission pattern that corresponds to the third pixel. The color filter layer may include a first color filter disposed between the second substrate and the first color conversion pattern; a second color filter disposed between the second substrate and the second color conversion pattern; and a third color filter disposed between the second substrate and the light transmission pattern.

Other aspects and features will become apparent and more readily appreciated from the following description of exemplary embodiments, the claims, and the accompanying drawings.

DETAILED DESCRIPTION

Figure 1:
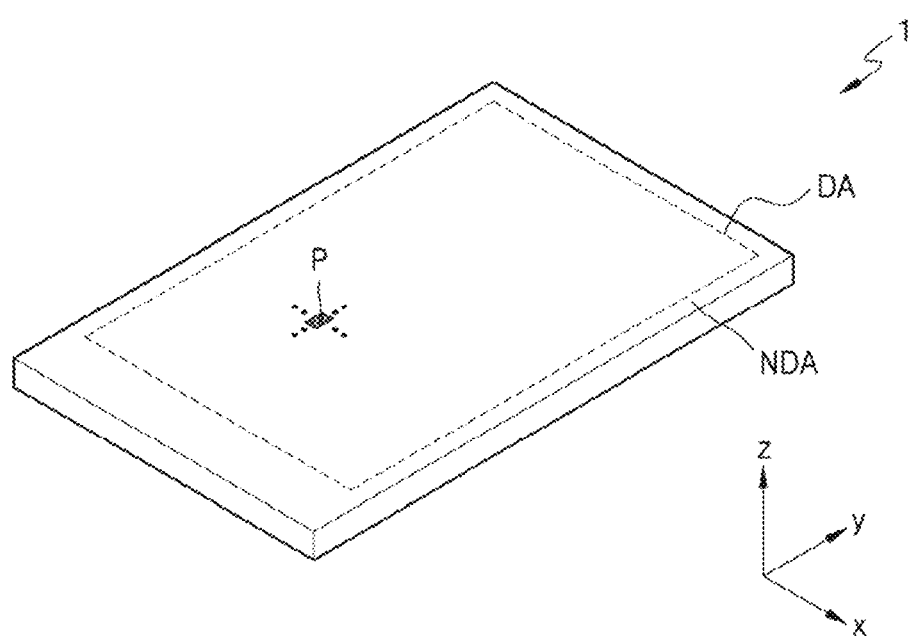
FIG. 1 is a perspective view of a display apparatus according to an embodiment.

Reference will now be made in detail to exemplary embodiments, examples of which are illustrated in the accompanying drawings, wherein like reference numerals may refer to like elements throughout. In this regard, exemplary embodiments may have different forms and should not be construed as being limited to the descriptions set forth herein.

It will be understood that when a layer, area, or element is referred to as being "formed on" another layer, area, or element, it may be "directly formed on" the other layer, region, or element, or intervening layers, areas, or elements may be present therebetween.

Sizes of Elements May be Exaggerated or Contracted for Convenience of Description The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display apparatus 1 according to an embodiment.

Referring to FIG. 1, according to an embodiment, the display apparatus 1 includes a display area DA where an image is displayed and a non-display area NDA where no image is displayed. The display apparatus 1 displays an image by using light emitted from the display area DA.

Although FIG. 1 illustrates the display apparatus 1 as having a rectangular display area DA, embodiments of the present disclosure are not limited thereto. In other embodiments, the display area DA may have a circular shape, an oval shape, or a polygonal shape such as a triangular shape or a pentagonal shape. In addition, although the display apparatus 1 of FIG. 1 is illustrated as a flat panel display apparatus that has a flat shape, embodiments are not limited thereto, and in other embodiments, the display apparatus 1 can have other various forms, such as a flexible display apparatus, a foldable display apparatus, or a rollable display apparatus, etc.

According to an embodiment, the display apparatus 1 includes a component located at one side of a first substrate 100 (see FIG. 2) that corresponds to the display area DA or the non-display area NDA.

According to an embodiment, the component is an electronic element that uses light or sound. For example, the electronic element can be a sensor, such as an infrared sensor that receives light and uses the received light, a camera that receives light and captures an image, a sensor that outputs and senses light or sound to measure distance or recognize a fingerprint, a small lamp that outputs light, or a speaker that outputs sound, etc.

Figure 2:
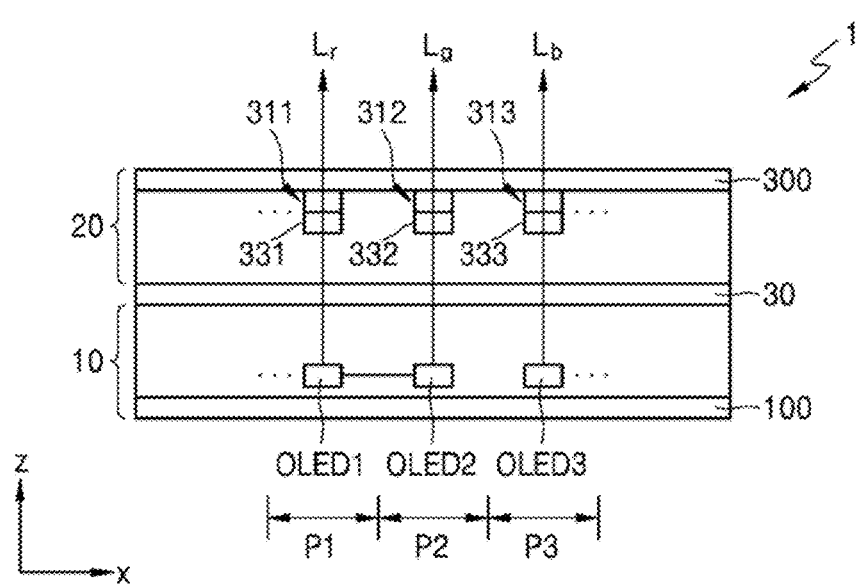
FIG. 2 is a cross-sectional view of a display apparatus according to an embodiment.

FIG. 2 is a cross-sectional view of a display apparatus 1 according to an embodiment.

Referring to FIG. 2, according to an embodiment, the display apparatus 1 include a display unit 10 and a color filter unit 20 that faces the display unit 10. The display unit 10 includes a first pixel P1, a second pixel P2, and a third pixel P3 disposed on the first substrate 100. The first pixel P1, the second pixel P2, and the third pixel P3 emit light of different colors. For example, the first pixel P1 may emit red light Lr, the second pixel P2 may emit green light Lg, and the third pixel P3 may emit blue light Lb.

According to an embodiment, the first pixel P1, the second pixel P2, and the third pixel P3 respectively include a first display element OLED1, a second display element OLED2, and a third display element OLED3, and the first display element OLED1, the second display element OLED2, and the third display element OLED3 each include an organic light-emitting diode (OLED). In a present embodiment, the first display element OLED1, the second display element OLED2, and the third display element OLED3 each emit blue light.

According to an embodiment, the color filter unit 20 includes color conversion layers 331, 332, and 333 and color filter layers 311, 312, and 313. Light emitted from the first display element OLED1, the second display element OLED2, and the third display element OLED3 passes through the color conversion layers 331, 332, and 333 and the color filter layers 311, 312, and 313 to be emitted as red light Lr, green light Lg, and blue light Lb, respectively.

According to an embodiment, color filter layers 311, 312, and 313 in the color filter unit 20 are directly located on a second substrate 300. In this case, the expression "directly located on the second substrate 300" means that the color filter unit 20 is manufactured by forming the color filter layers 311, 312, and 313 directly on the second substrate 300. Thereafter, the respective color filter layers 311, 312, and 313 that respectively correspond to the first pixel P1, the second pixel P2, and the third pixel P3 are arranged to face the first pixel P1, the second pixel P2, and the third pixel P3, such that the display unit 10 is bonded to the color filter layers 311, 312, and 313. In FIG. 2, the display unit 10 is bonded to the color filter unit 20 by using an adhesive layer 30. The adhesive layer 30 is, for example, an optical clear adhesive (OCA), but embodiments are not necessarily limited thereto. In other embodiments, the adhesive layer 30 is omitted.

Figure 4A:
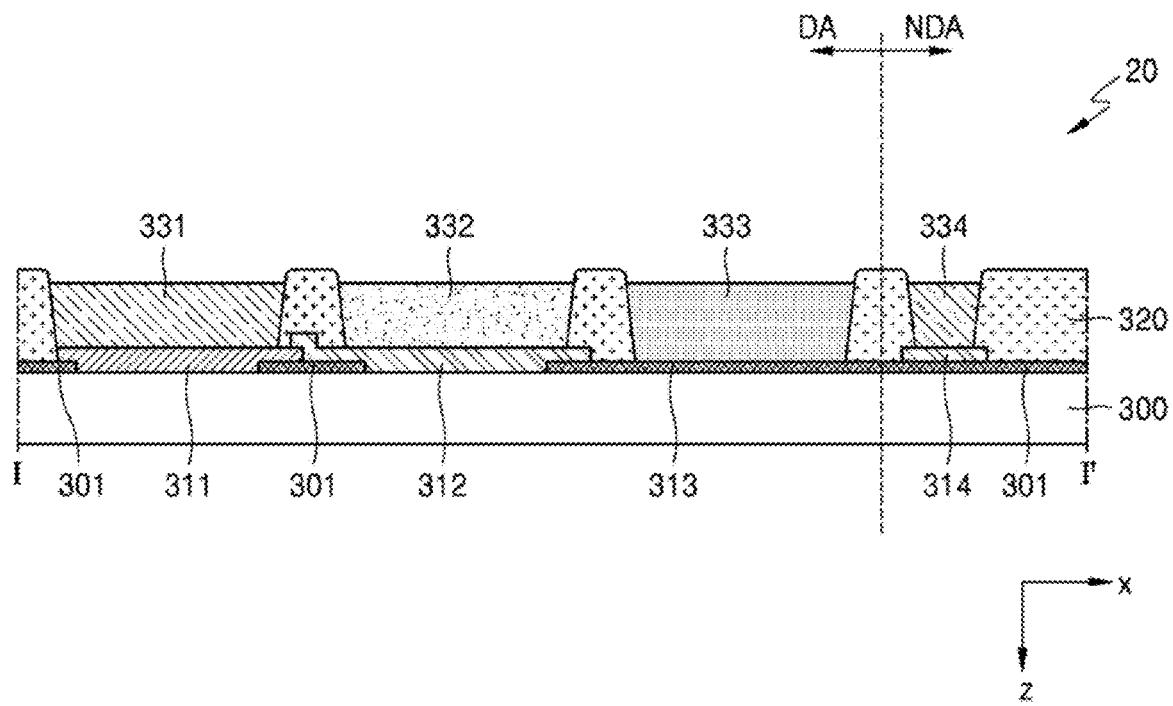
FIGS. 4A to 4C are cross-sectional views of a display apparatus taken along line I-I' of FIG. 3.

In an embodiment, the color conversion layers 331, 332, and 333 in the color filter unit 20 are directly disposed on the display unit 10. In this case, as shown in FIG. 4A, the expression "directly disposed on the display unit 10" means that the color conversion layers 331, 332, and 333 is directly formed on the display unit 10 to form an integrated structure without manufacturing a separate color filter unit 20. In this case, the color conversion layers 331, 332, and 333 are disposed on a thin-film encapsulation layer 400, to be described below with respect to FIG. 7. In some cases, after "other layers" are placed between the color conversion layers 331, 332, and 333 and the thin-film encapsulation layer 400, the color conversion layers 331, 332, and 333 are formed thereon. For example, the "other layers" can be organic layers, inorganic layers, conductive layers, or composite layers thereof. For example, an insulating layer may be disposed on the thin-film encapsulation layer 400.

Figure 3:
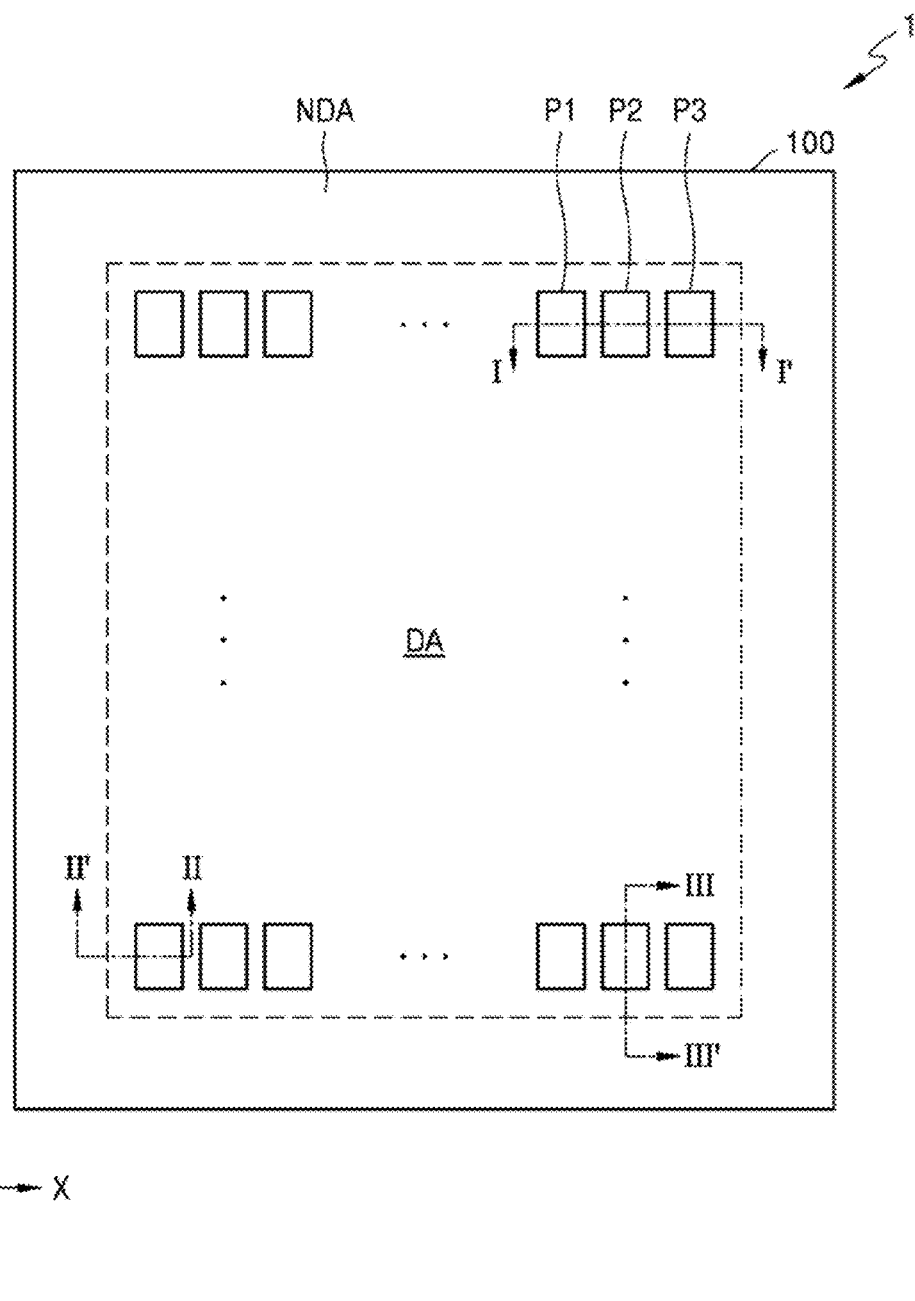
FIG. 3 is a plan view of a display apparatus according to an embodiment.

FIG. 3 is a plan view of a display apparatus 1 according to an embodiment.

Referring to FIG. 3, the display apparatus 1 according to an embodiment includes a display area DA that includes a plurality of pixels and a non-display area NDA that surrounds the display area DA. The plurality of pixels includes a first pixel P1, a second pixel P2, and a third pixel P3. The first pixel P1, the second pixel P2, and the third pixel P3 emit red light Lr, green light Lg, and blue light Lb, respectively.

In an embodiment, the first pixel P1, the second pixel P2, and the third pixel P3 are arranged in a repeated and regular manner in the display area. For example, after a first pixel P1, a second pixel P2, and a third pixel P3 are arranged, another first pixel P1, another second pixel P2, and another third pixel P3 are arranged again in this order after the third pixel P3. However, embodiments are not limited thereto, and in other embodiments, the arrangement of the pixels P varies from the above order.

In an embodiment, each pixel P is regularly arranged in the display area DA. Although FIG. 3 illustrates that the pixels P are arranged in rows and columns, embodiments are not limited thereto, and in other embodiments, the arrangement of the pixels P is variously changed. For example, the pixels P can be arranged in a Pentile pattern.

In an embodiment, the non-display area NDA at least partially surrounds the display area DA. In an embodiment, as shown in FIG. 3, the non-display area NDA entirely surrounds the display area DA. In another embodiment, the non-display area NDA partially surrounds an outer peripheral portion of the display area DA.

Figure 4B:
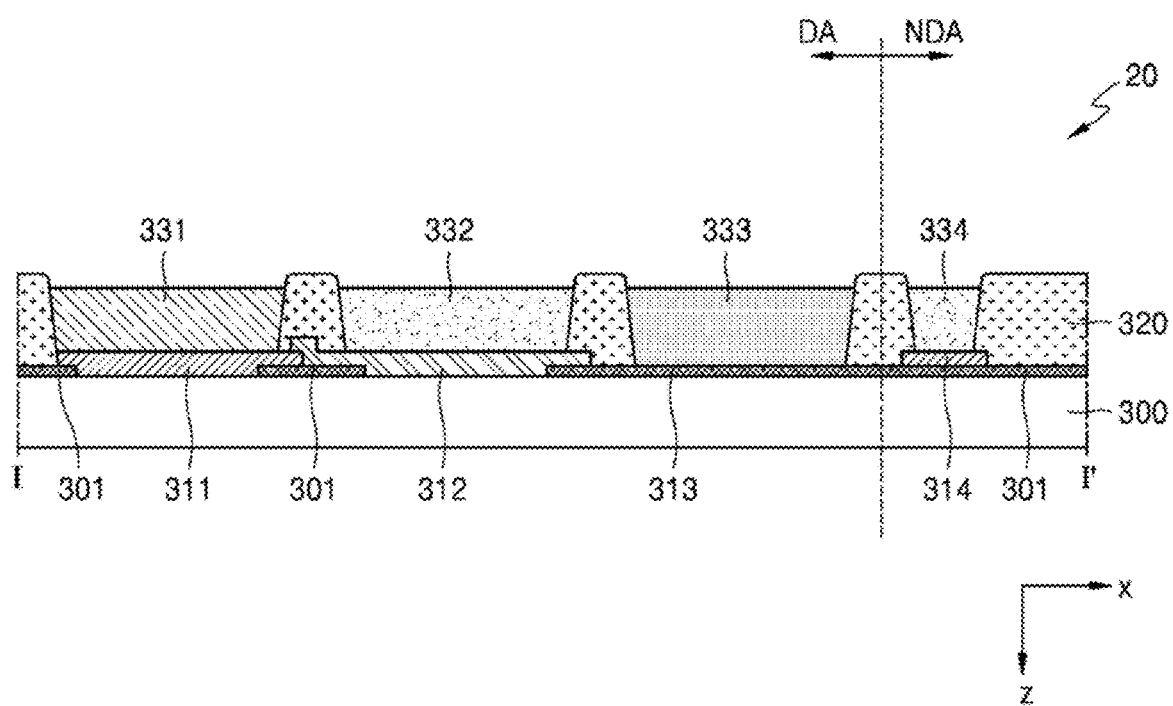
Figure 4C:
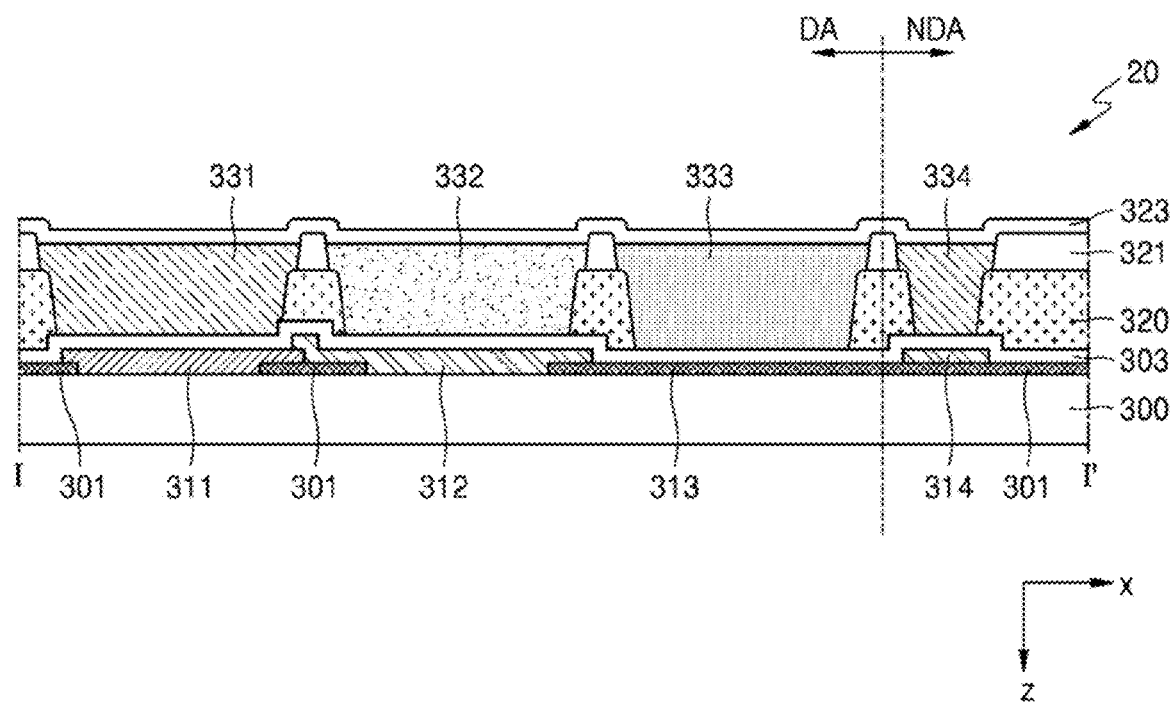

FIGS. 4A to 4C are cross-sectional views of a display apparatus 1 taken along line I-I' of FIG. 3.

Figure 7:
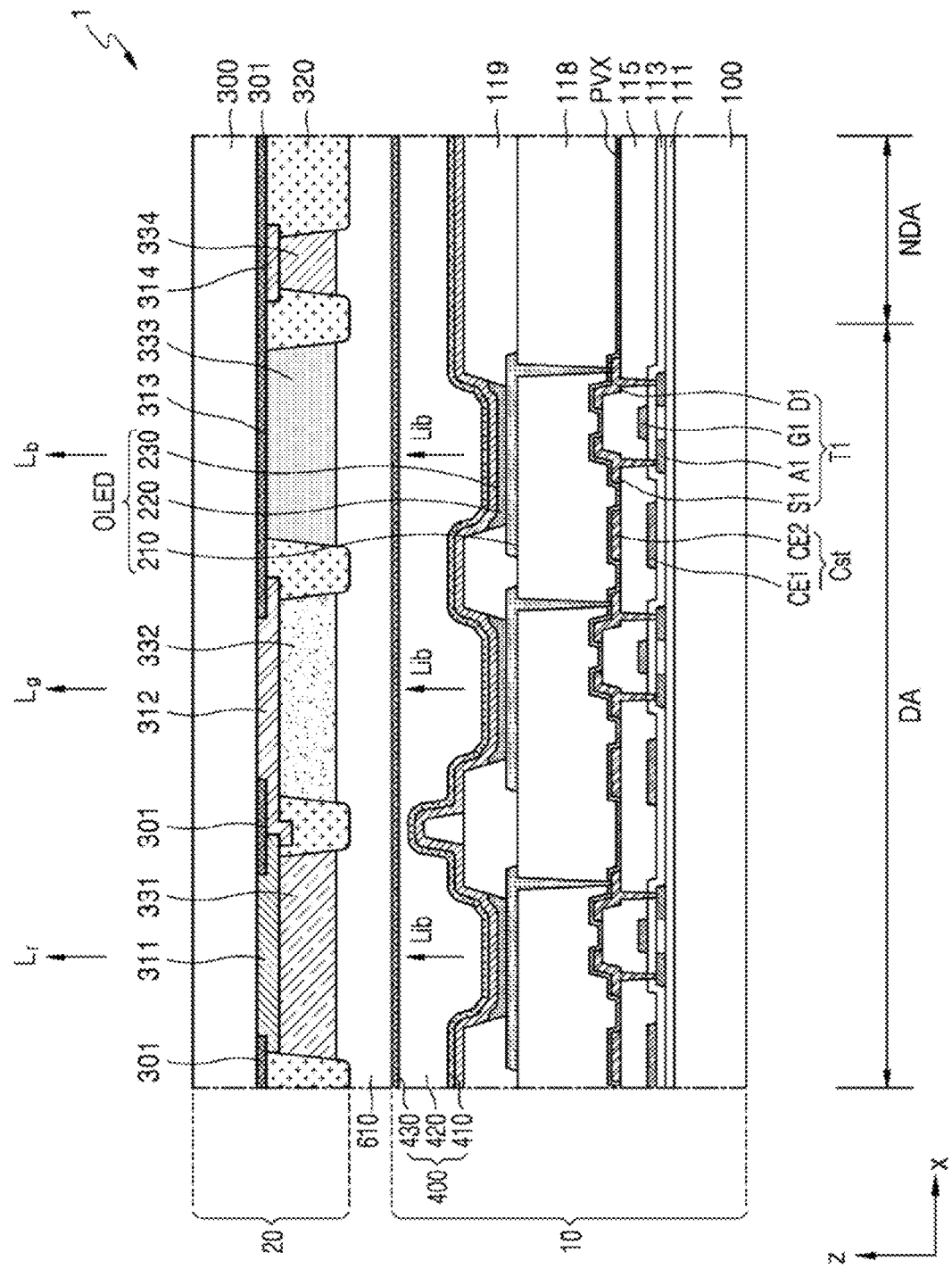
FIG. 7 is a cross-sectional view of a display apparatus according to an embodiment.

Referring to FIGS. 4A to 4C, according to an embodiment, the elements of the color filter unit 20 are disposed on the second substrate 300. Hereinafter, although the elements of the color filter 20 are described as being disposed on the second substrate 300 in the description of FIGS. 4A through 4C, the color filter unit 20 can be substantially turned upside down such that the second substrate 300 is located at the top as shown in FIG. 7 to be described below. In FIGS. 4A through 4C, components of the color filter unit 20 will be described in an order of their manufacture. Accordingly, in the description of FIGS. 4A through 4C, when a "B layer" is disposed on an "A layer", the "B layer" can be disposed below the "A layer" in the display apparatus 1.

In an embodiment, color conversion layers 331, 332, and 333 that respectively correspond to the color filter layers 311, 312, and 313, color filter layers 311, 312, and 313 between the second substrate 300 and the color conversion layers 331, 332, and 333, a dummy color conversion pattern 334 disposed in the non-display area NDA, and a dummy color filter 314 between the second substrate 300 and the dummy color conversion pattern 334, are disposed on the second substrate 300. The dummy color conversion pattern 334 includes the same material as a portion of the color conversion layers 331, 332, and 333.

In an embodiment, the color conversion layer include a first color conversion pattern 331 that corresponds to the first pixel P1, a second color conversion pattern 332 that corresponds to the second pixel P2, a light transmission pattern 333 that corresponds to the third pixel P3, and a dummy color conversion pattern 334 that corresponds to the non-display area NDA. The first color conversion pattern 331, the second color conversion pattern 332, the light transmission pattern 333, and the dummy color conversion pattern 334 are spaced apart from each other.

In an embodiment, the first color conversion pattern 331 includes first quantum dots that convert incident light into light of a first color, the second color conversion pattern 332 includes second quantum dots that convert incident light into light of a second color, and the light transmission pattern 333 includes light-scattering particles that scatter incident light. The first quantum dots of the first color conversion pattern 331 and the second quantum dots of the second color conversion pattern 332 have different sizes and structures. For example, as the first quantum dots and the second quantum dots have different particle sizes, they may emit different colored light. For example, the light of a first color and the light of a second color have a wavelength longer than that of the incident light. The light transmission pattern 333 includes light-scattering particles that scatter incident light and do not include quantum dots. For example, light output from the light transmission pattern 333 has the same wavelength as light incident into the light transmission pattern 333.

In an embodiment, the first color light emitted by the first pixel P1 is red light Lr, the second color light emitted by the second pixel P2 is green light Lg, and the third color light emitted by the third pixel P3 is blue light Lb.

In an embodiment, each of the first color conversion pattern 331, the second color conversion pattern 332, and the light transmission pattern 333 includes a photosensitive polymer in which quantum dots and light scattering particles are dispersed. The quantum dots convert incident light into light of a specific wavelength band and emit the light. The photosensitive polymer is an organic material having light transmittance. The light scattering particles scatter a portion of incident light that is not absorbed by the quantum dots to cause more quantum dots to be excited, thereby increasing a color conversion rate of the first color conversion pattern 331 and the second color conversion pattern 332. For example, the light scattering particles include titanium oxide ($TiO_2$) or metal particles.

In an embodiment, a core of each quantum dot is selected from a II-VI compound, a III-V compound, a IV-VI compound, a IV element, or a IV compound, or combinations thereof.

In an embodiment, the II-VI compound is one of: a binary compound that is one of CdSe, CdTe, ZnS, ZnSe, ZnTe, ZnO, HgS, HgSe, HgTe, MgSe or MgS, or mixtures thereof; a ternary compound that is one of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS, or mixtures thereof; or a quaternary compound that is one of HgZnTeS, CdZnSeS, CdZnSeTe, CdZnSTe, CdHgSeS, CdHgSeTe, CdHgSTe, HgZnSeS, HgZnSeTe or HgZnSTe, or mixtures thereof.

In an embodiment, the III-VI compound is one of: a binary compound that is one of GaN, GaP, GaAs, GaSb, AlN, AlP, AlAs, ASb, InN, InP, InAs or InSb, or mixtures thereof; a ternary compound that is one of GaNP, GaNAs, GaNSb, GaPAs, GaPSb, AlNP, AlNAs, AlNSb, AlPAs, AlPSb, InGaP, InNP, InNAs, InNSb, InPAs, InPSb or GaAlNP, or mixtures thereof; or a quaternary compound that is one of GaAlNAs, GaANSb, GaAlPAs, GaAlPSb, GaInNP, GaInNAs, GaInNSb, GaInPAs, GaInPSb, InAlNP, InAlNAs, InAlNSb, InAlPAs or InAlPSb, or mixtures thereof.

In an embodiment, the IV-VI compound is one of of: a binary compound that is one of SnS, SnSe, SnTe, PbS, PbSe or PbTe, or mixtures thereof; a ternary compound that is one of SnSeS, SnSeTe, SnSTe, PbSeS, PbSeTe, PbSTe, SnPbS, SnPbSe or SnPbTe, or mixtures thereof; and a quaternary compound that is one of SnPbSSe, SnPbSeTe or SnPbSTe, or mixtures thereof. The IV element is one of of Si or Ge, or mixtures thereof. The IV compound is a binary compound that is one of SiC or SiGe, or mixtures thereof.

In this case, in an embodiment, the binary compound, the ternary compound, or the quaternary compound are present in a particle at a uniform concentration, or are present in the same particle with different concentration within the same particle. In addition, a quantum dot has a core-shell structure with a shell that surrounds a quantum dot core. An interface between a core and a shell has a concentration gradient in which a concentration of an element present in the shell decreases toward a center of the core.

In some embodiments, the quantum dots have a core-shell structure that includes a core that includes nanocrystals and a shell that surrounds the core. The shell of the quantum dot is a protection layer that maintains semiconductor characteristics by preventing a chemical transformation of the core, or is a charging layer that provides electrophoretic characteristics to the quantum dot. The shell may have a single layer or multiple layers. Examples of a shell of a quantum dot include a metal or non-metal oxide, a semiconductor compound, or combinations thereof.

For example, in an embodiment, the metal or non-metal oxide may be one of a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ or $NiO$, or one of a ternary compound such as $MgA_2O_4$, $CoFe_2O_4$, $NiFe_2O_4$, or $CoMn_2O_4$, but embodiments of the present disclosure are not limited thereto.

In addition, in an embodiment, the semiconductor compound may be one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but embodiments of the present disclosure are not limited thereto.

In an embodiment, the quantum dots have a full width of half maximum (FWHM) of a light-emitting wavelength spectrum of about 45 nm or less, about 40 nm or less, or about 30 nm or less, and color purity or color reproducibility is improved within this range. In addition, light emitted through the quantum dots is emitted in all directions, and thus, an optical field of view is improved.

In addition, in an embodiment, a shape of the quantum dots is not particularly limited to a shape generally used in the art, but more specifically, the quantum dots may have a spherical, pyramidal, multi-arm shape, or may be cubic nanoparticles, nanotubes, nanowires, nanofibers, or nanoplates.

In an embodiment, the quantum dots convert a color of emitted light according to a particle size, and thus, the quantum dots can have various emission colors, such as blue, red, or green.

In an embodiment, the color filter layers 311, 312, and 313 are disposed between the second substrate 300 and the color conversion layers 331, 332, and 333. The color filter layer include a first color filter 311 between the second substrate 300 and the first color conversion pattern 331, a second color filter 312 between the second substrate 300 and the second color conversion pattern 332, and a third color filter 313 between the second substrate 300 and the light transmission pattern 333. The first color filter 311, the second color filter 312, and the third color filter 313 are directly disposed on the second substrate 300.

In an embodiment, the first color filter 311 selectively transmits light of a first color, the second color filter 312 selectively transmits light of a second color, and the third color filter 313 selectively transmits light of a third color. For example, the first color filter 311 corresponds to the first pixel P1 to selectively transmit red light Lr, the second color filter 312 corresponds to the second pixel P2 to selectively transmit green light Lg, and the third color filter 313 corresponds to the third pixel P3 to selectively transmit blue light Lb.

In an embodiment, a first partition 320 is disposed between the first color conversion pattern 331 and the second color conversion pattern 332, between the second color conversion pattern 332 and the light transmission pattern 333, and between the light transmission pattern 333 and the dummy color conversion pattern 334. In addition, the first partition 320 is disposed on the non-display area. The first partition 320 has an opening that exposes a central portion of the color filter layers 311, 312, and 313 to define an emission area of a pixel. The first partition 320 is formed of an organic insulating material such as polyimide, polyamide, an acryl resin, benzocyclobutene, hexamethyldisiloxane (HMDSO), or a phenol resin, etc., by using a method such as spin coating, etc. In an embodiment, the first partition 320 includes a lyophobic material to provide a lyophobic characteristic such that a material that forms the first color conversion pattern 331, the second color conversion pattern 332, and the light transmission pattern 333 is not applied to a non-emission area during an inkjet process.

When first partitions 320 of the display area DA and the non-display area NDA are formed in display apparatuses of the related art, a first partition 320 of the non-display area NDA adjacent to the display area DA may be too high. To reduce a height of the first partitions 320, a dummy pattern is formed in the non-display area NDA adjacent to the display area DA by using quantum dots. However, when the dummy pattern is formed by using quantum dots, blue light is emitted by the quantum dots. However, according to embodiments of the disclosure, since a dummy pattern is formed by using the dummy color conversion pattern 334, which includes quantum dots, and the dummy color filter 314, a height of the first partition 320 of the non-display area NDA adjacent to the display area DA is reduced, and blue light is not emitted to provide a display apparatus with improved product reliability.

In an embodiment, the dummy color conversion pattern 334 corresponds to the non-display area NDA, and the dummy color conversion pattern 334 includes the same material as a portion of the color conversion layers 331, 332, and 333. The dummy color conversion pattern 334 includes the same material as the first color conversion pattern 331 or the second color conversion pattern 332. In an embodiment, the dummy color conversion pattern 334 includes first quantum dots that convert incident light into first color light or second quantum dots that convert incident light into second color light.

In an embodiment, the dummy color filter 314 is disposed between the second substrate 300 and the dummy color conversion pattern 334. The dummy color filter 314 includes the same material as the color filter layers 311, 312, and 313. The dummy color filter 314 includes the same material as the first color filter 311 or the second color filter 312. In an embodiment, the dummy color filter 314 selectively transmits first color light or second color light.

In an embodiment, the dummy color filter 314 transmits light of a color that differs from that of light emitted from the dummy color conversion pattern 334. For example, as shown in FIG. 4A, when the dummy color conversion pattern 334 includes the same material as the first color conversion pattern 331 and converts the incident light into first color light, the dummy color filter 314 includes the same material as the second color filter 312 and selectively transmits second color light. As shown in FIG. 4B, when the dummy color conversion pattern 334 includes the same material as the second color conversion pattern 332 and converts the incident light into second color light, the dummy color filter 314 includes the same material as the first color filter 311 and selectively transmits first color light. Therefore, in an embodiment, by preventing light converted by the dummy color conversion pattern 334 from being transmitted therethrough, light is not emitted from the non-display area NDA, and the reliability of the display apparatus is improved.

In an embodiment, a light-shielding member 301 is disposed between the second substrate 300 and the first partitions 320 located in the display area DA and the non-display area NDA. The light-shielding member 301 is disposed between the first pixel P1 and the second pixel P2 and between the second pixel P2 and the third pixel P3 to correspond to the first partitions 320 located in the display area DA, and is disposed between the second substrate 300 and the first partition 320 in the non-display area NDA to correspond to the first partition 320 located in the non-display area NDA. The light-shielding member 301 is an auxiliary light shielding element that prevents light from being emitted from a non-emission area. The light-shielding member 301 includes the same material as the third color filter 313. In an embodiment, the light-shielding member 301 includes one or more of a black matrix, a black pigment, or a metal material, etc.

Referring to FIG. 4C, in an embodiment, a first inorganic insulating layer 303 extends between the first color filter 311 and the first color conversion pattern 331, between the second color filter 312 and the second color conversion pattern 332, and between the third color filter 313 and the light transmission pattern 333. In an embodiment, the first inorganic insulating layer 303 is disposed between the dummy color filter 314 and the dummy color conversion pattern 334. The first inorganic insulating layer 303 covers the first color filter 311, the second color filter 312, and the third color filter 313, which improves an emission efficiency of the display apparatus.

In an embodiment, a second partition 321 is disposed on the first partition 320. The second partition 321 includes a lyophobic material to provide a lyophobic characteristic such that a material forming the first color conversion pattern 331, the second color conversion pattern 332, and the light transmission pattern 333 is not applied to the non-emission area during an inkjet process.

In an embodiment, a second inorganic insulating layer 323 is disposed on the first color conversion pattern 331, the second color conversion pattern 332, the light transmission pattern 333, and the second partition 321. In an embodiment, the second inorganic insulating layer 323 is disposed on the dummy color conversion pattern 334. Each of the first inorganic insulating layer 303 and the second inorganic insulating layer 323 includes a light-transmissive inorganic insulating material. For example, the first inorganic insulating layer 303 and the second inorganic insulating layer 323 include a material such as silicon oxide ($SiO_x$), silicon nitride ($SiN_x$), or silicon oxynitride (SiON).

Figure 5A:
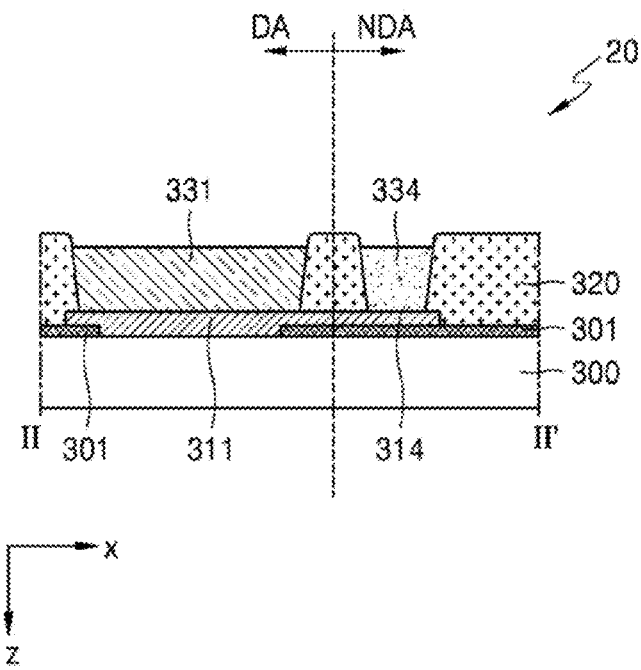
FIGS. 5A and 5B are cross-sectional views of a display apparatus taken along line II-II' of FIG. 3.
Figure 5B:
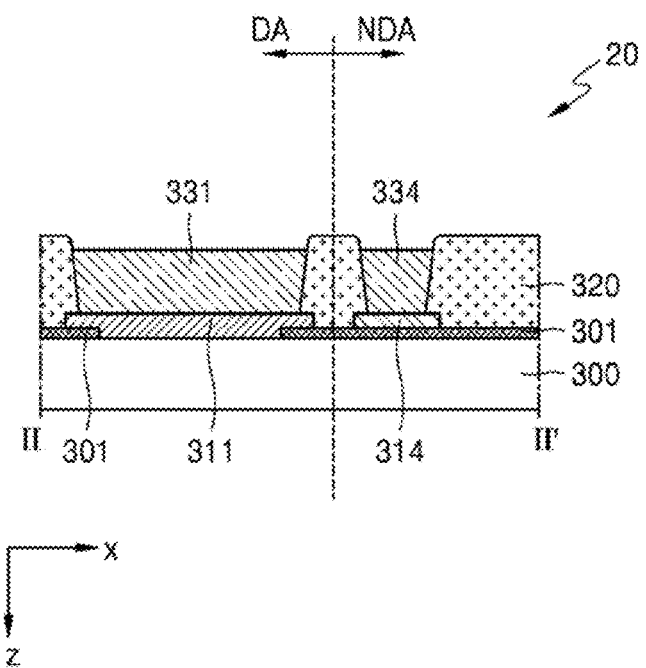

FIGS. 5A and 5B are cross-sectional views of a display apparatus taken along line II-II' of FIG. 3.

Referring to FIGS. 5A and 5B, according to an embodiment, the elements of the color filter unit 20 are disposed on the second substrate 300. Hereinafter, although the elements of the color filter 20 are described as being disposed on the second substrate 300 in the description of FIGS. 5A and 5B, the color filter unit 20 can be turned upside down such that the second substrate 300 is located at the top as shown in FIG. 7 to be described below. In FIGS. 5A and 5B, components of the color filter unit 20 will be described in an order of their manufacture. Accordingly, in a description of FIGS. 5A and 58, when a "B layer" is disposed on an "A layer" the "B layer" can be disposed below the "A layer" in the display apparatus.

Referring to FIG. 5A, the color filter unit 20 according to an embodiment includes the second substrate 300 that includes the display area DA and the non-display area NDA around the display area DA, the first color conversion pattern 331 disposed on the second substrate 300 in the display area DA, a first color filter 311 disposed between the second substrate 300 and the first color conversion pattern 331, a dummy color conversion pattern 334 disposed on the second substrate 300 in the non-display area NDA, and a dummy color filter 314 disposed between the second substrate 300 and the dummy color conversion pattern 334.

In an embodiments, the first color conversion pattern 331 includes first quantum dots that convert incident light into first color light. For example, the first color conversion pattern 331 converts blue light Lb into red light Lr. The first color filter 311 selectively transmits first color light. The first color filter 311 selectively transmits red light Lr converted by the first color conversion pattern 331.

Referring to FIG. 5A, according to an embodiment, the dummy color conversion pattern 334 includes second quantum dots that convert incident light into second color light. For example, the dummy color conversion pattern 334 converts blue light Lb into green light Lg. The dummy color filter 314 selectively transmits first color light. For example, the dummy color filter 314 selectively transmits red light Lr. When the dummy color conversion pattern 334 includes second quantum dots that convert incident light into light of a second color, the dummy color filter 314 includes the same material as the first color filter 311 that selectively transmits first color light and selectively transmits first color light. Therefore, by preventing light converted by the dummy color conversion pattern 334 from being transmitted therethrough, light is not emitted from the non-display area NDA, which improves a reliability of the display apparatus.

Referring to FIG. 5B, according to an embodiment, the dummy color conversion pattern 334 includes first quantum dots that convert incident light into first color light. For example, the dummy color conversion pattern 334 converts blue light Lb into red light Lr. The dummy color filter 314 selectively transmits light of a second color. For example, the dummy color filter 314 selectively transmits red light Lr. When the dummy color conversion pattern 334 includes the same material as the first color conversion pattern 331 that includes first quantum dots that convert incident light into first color light, the dummy color filter 314 selectively transmits second color light. Therefore, by preventing light converted by the dummy color conversion pattern 334 from being transmitted therethrough, light is not emitted from the non-display area NDA, which improves a reliability of the display apparatus.

In an embodiment, the first partition 320 is disposed between the first color conversion pattern 331 and the dummy color conversion pattern 334, and the light-shielding member 301 is disposed between the second substrate 300 and the first partition 320 and corresponds to the first partition 320 in the display area DA and the non-display area NDA.

Figure 6A:
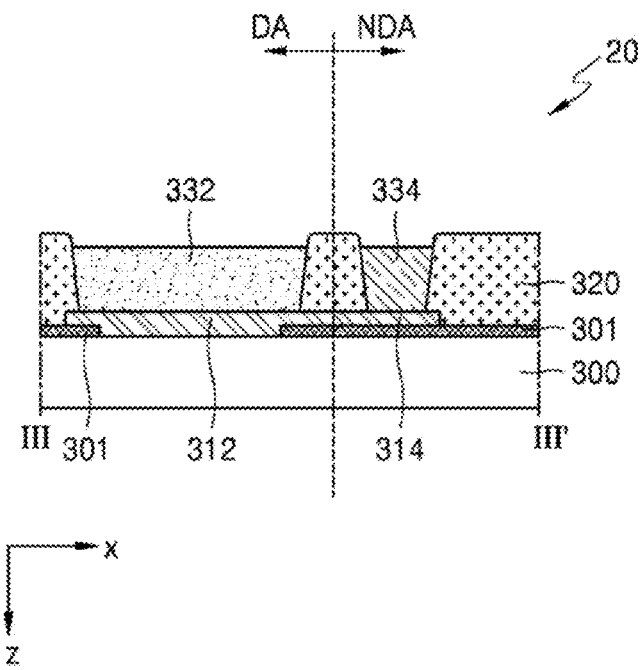
FIGS. 6A and 6B are cross-sectional views of a display apparatus taken along line III-III' of FIG. 3.
Figure 6B:
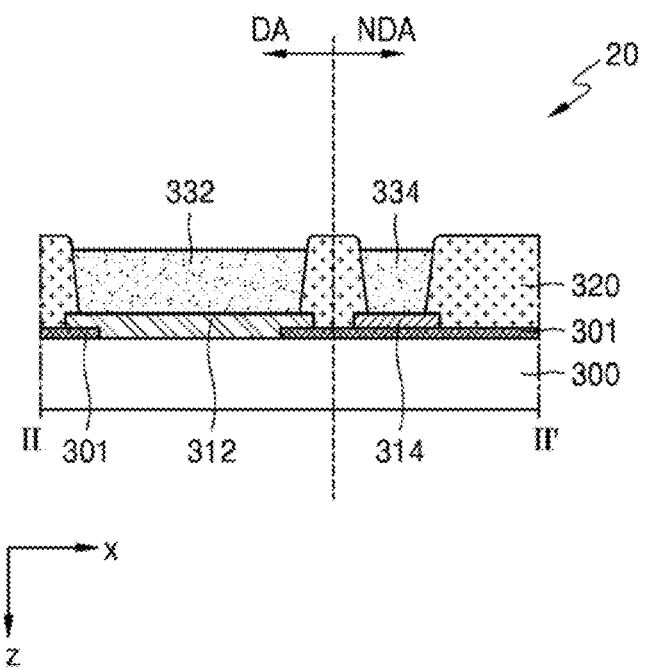

FIGS. 6A and 6B are cross-sectional views of a display apparatus taken along line III-III' of FIG. 3.

Referring to FIGS. 6A and 6B, according to an embodiment, the elements of the color filter unit 20 are disposed on the second substrate 300. Hereinafter, although the elements of the color filter 20 are described as being disposed on the second substrate 300 in the description of FIGS. 6A and 6B, the color filter unit 20 may be turned upside down such that the second substrate 300 is disposed on top as shown in FIG. 7 to be described below. In FIGS. 6A and 6B, components of the color filter unit 20 will be described in their order of manufacture. Accordingly, in a description of FIGS. 6A and 68, when a "B layer" is arranged on an "A layer", the "B layer" can be disposed below the "A layer" in the display apparatus.

Referring to FIG. 6A, the color filter unit 20 according to an embodiment includes the second substrate 300 that includes the display area DA and the non-display area NDA around the display area DA, the second color conversion pattern 332 disposed on the second substrate 300 in the display area DA, the second color filter 312 disposed between the second substrate 300 and the second color conversion pattern 332, a dummy color conversion pattern 334 disposed on the second substrate 300 in the non-display area NDA, and a dummy color filter 314 disposed between the second substrate 300 and the dummy color conversion pattern 334.

In an embodiment, the second color conversion pattern 332 includes second quantum dots that convert incident light into second color light. For example, the second color conversion pattern 332 converts blue light Lb into green light Lg. The second color filter 312 selectively transmits second color light. The second color filter 312 selectively transmits the green light Lg converted through the second color conversion pattern 332.

Referring to FIG. 6A, according to an embodiment, the dummy color conversion pattern 334 includes first quantum dots that convert incident light into first color light. For example, the dummy color conversion pattern 334 converts blue light Lb into red light Lr. The dummy color filter 314 selectively transmits second color light. For example, the dummy color filter 314 selectively transmits red light Lr. When the dummy color conversion pattern 334 includes first quantum dots that convert incident light into first color light and converts the incident light into first color light, the dummy color filter 314 includes the same material as the second color filter 312 that selectively transmits second color light. Therefore, by preventing light converted by the dummy color conversion pattern 334 from being transmitted therethrough, light is not emitted from the non-display area NDA, which improves a reliability of the display apparatus may be improved.

Referring to FIG. 6B, according to an embodiment, the dummy color conversion pattern 334 includes second quantum dots that convert incident light into second color light. For example, the dummy color conversion pattern 334 converts blue light Lb into green light Lg. The dummy color filter 314 selectively transmits first color light. For example, the dummy color filter 314 selectively transmit red light Lr. When the dummy color conversion pattern 334 includes second quantum dots that convert incident light into second color light, the dummy color filter 314 selectively transmits first color light. Therefore, by preventing light converted by the dummy color conversion pattern 334 from being transmitted therethrough, light is not emitted from the non-display area NDA, which improves a reliability of the display apparatus.

In an embodiment, the first partition 320 is disposed between the second color conversion pattern 332 and the dummy color conversion pattern 334, and the light-shielding member 301 is disposed between the second substrate 300 and the first partition 320 and corresponds to the first partition 320 in the display area DA and the non-display area NDA.

FIG. 7 is a cross-sectional view of a display apparatus 1 according to an embodiment.

Referring to FIG. 7, the display area DA includes a driving thin-film transistor T1 and a storage capacitor Cst. For convenience of description, the elements of the display area DA of FIG. 7 will be described according to a stacking order.

According to an embodiment, the first substrate 100 includes glass or a polymer resin. The polymer resin may be one or more of polyethersulfone, polyacrylate, polyetherimide, polyethylene naphthalate, polyethylene terephthalate, polyphenylene sulfide, polyarylate, polyimide, polycarbonate, or cellulose acetate propionate, etc. When the first substrate 100 includes a polymer resin, the first substrate is flexible, rollable, or bendable. The first substrate 100 may have a multi-layer structure that includes a polymer resin layer described above and an inorganic layer.

According to an embodiment, a buffer layer 111 is disposed on the first substrate 100 to reduce or block penetration of foreign substances, moisture, or external air from a lower portion of the first substrate 100 and provide a flat surface on the first substrate 100. The buffer layer 111 may include an inorganic material such as an oxide or a nitride, an organic material, or an organic/inorganic composite, and may have a single-layer or a multi-layer structure of the inorganic material and the organic material. A barrier layer that blocks penetration of external air is further disposed between the first substrate 100 and the buffer layer 111.

According to an embodiment, a semiconductor layer A1 of the driving thin-film transistor T1 is disposed on the buffer layer 111. The semiconductor layer A1 includes amorphous silicon or polysilicon. In an embodiment, the semiconductor layer A1 includes an oxide of at least one of indium (In), gallium (Ga), stanium (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). In some embodiments, the semiconductor layer A1 is formed of a Zn oxide-based material, such as a Zn oxide, an In—Zn oxide, or a Ga—In—Zn oxide. For example, the semiconductor layer A1 may be one of an In—Ga—Zn— (IGZO), In—Sn—Zn—O (ITZO), or In—Ga—Sn—Zn—O (IGZO) semiconductor in which a metal such as In, Ga, or Sn is contained in ZnO. The semiconductor layer A1 includes a channel region, and a source region and a drain region locates at both sides of the channel region. The semiconductor layer A1 may have a single layer or a multi-layer structure.

According to an embodiment, a gate electrode G1 of the driving thin-film transistor T1 that at least partially overlaps the semiconductor layer A1 is disposed on the semiconductor layer A1 with a gate insulating layer 113 disposed therebetween. The gate electrode G1 includes one or more of molybdenum (Mo), aluminum (Al), copper (Cu), or titanium (Ti), etc., and may have a single layer or a multi-layer structure. For example, the gate electrode G1 can be a single layer of Mo. A first electrode CE1 of the storage capacitor Cst is disposed on the same layer as the gate electrode G1. The first electrode CE1 is formed of the same material as the gate electrode G1.

According to an embodiment, an interlayer insulating layer 115 is disposed on the gate insulating layer 113 and covers the gate electrode G1 and the first electrode CE1 of the storage capacitor Cst. The interlayer insulating layer 115 includes one or more of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

According to an embodiment, a second electrode CE2 of the storage capacitor Cst, and a source electrode S1 and a drain electrode D1 of the driving thin-film transistor T1 are disposed on the interlayer insulating layer 115. The second electrode CE2, the source electrode S1, and the drain electrode D1 of the storage capacitor Cst include a conductive material, such as Mo, Al, Cu, or Ti, etc., and have a multi-layer or single layer structure that includes the above materials. In an embodiment, the second electrode CE2, the source electrode S1, and the drain electrode D1 have a multi-layer structure of Ti/Al/Ti. The source electrode S1 and the drain electrode D1 are connected to a source region or a drain region of the semiconductor layer µl via contact holes.

According to an embodiment, the second electrode CE2 of the storage capacitor Cst overlaps the first electrode CE1 with the interlayer insulating layer 115 disposed therebetween, and forms a capacitor. In this case, the interlayer insulating layer 115 functions as a dielectric layer of the storage capacitor Cst.

According to an embodiment, the interlayer insulating layer 115, the second electrode CE2, the source electrode S1, and the drain electrode D1 are covered with an inorganic protection layer PVX. The inorganic protection layer PVX may be a single layer or a multi-layer of $SiN_x$ or $SiO_x$. The inorganic protection layer PVX covers and protect wires on the interlayer insulating layer 115. Wires and data lines that are formed in a same process are exposed in a portion of a peripheral area of the first substrate 100. The exposed portions of wires can be damaged by an etchant used in patterning a pixel electrode 210 to be described below. Since the inorganic protection layer PVX covers at least a portion of the data lines and the wires, the wires are protected while patterning the pixel electrode 210.

According to an embodiment, a planarization layer 118 is disposed on the inorganic protection layer PVX, and an organic light-emitting diode OLED is disposed on the planarization layer 118. The planarization layer 118 includes one or more general-purpose polymers such as benzocyclobutene (BCB), polyimide (PI), HMDSO, poly(methyl methacrylate) (PMMA), or polystyrene (PS), polymer derivatives that include phenol-based groups, acryl-based polymers, imide-based polymers, arylether-based polymers, amide-based polymers, fluorine-based polymers, p-xylene-based polymers or vinyl alcohol-based polymers, or blends thereof. The planarization layer 118 may include an inorganic material. The planarization layer 118 includes at least one of $SiO_2$, $SiN_x$, SiON, $Al_2O_3$, $TiO_2$, $Ta_2O_5$, $HfO_2$, or $ZnO_2$. When the planarization layer 118 is formed of an inorganic material, chemical planarization polishing can in some cases be performed in some cases. The planarization layer 118 may include both an organic material and an inorganic material.

According to an embodiment, in the display area DA of the first substrate 100, the organic light-emitting diode OLED is disposed on the planarization layer 118. The organic light-emitting diode OLED includes a pixel electrode 210, an intermediate layer 220 that includes an emission layer, and an opposite electrode 230.

According to an embodiment, the pixel electrode 210 is disposed on the planarization layer 118. The pixel electrode 210 may be a (semi-)transparent electrode or a reflective electrode. In some embodiments, the pixel electrode 210 includes a reflective film formed of silver (Ag), magnesium (Mg), Al, platinum (Pt), palladium (Pd), gold (Au), nickel (Ni), neodymium (Nd), iridium (Ir) or Cr, or compounds thereof, and a transparent or semi-transparent electrode layer formed on the reflective film. The transparent or semi-transparent electrode layer includes at least one of indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 210 has a stacked structure of ITO/Ag/ITO.

According to an embodiment, a pixel-defining layer 119 is disposed on the planarization layer 118, and the pixel-defining layer 119 defines an emission area of a pixel by having an opening that exposes a central portion of the pixel electrode 210. In addition, the pixel-defining layer 119 increases a distance between an edge of the pixel electrode 210 and the opposite electrode 230 above the pixel electrode 210, thereby preventing an arc from occurring at the edge of the pixel electrode 210. The pixel-defining layer 119 is formed of an organic insulating material such as polyimide, polyamide, an acryl resin, benzocyclobutene, HMDSO, or a phenol resin, etc., by using a method such as spin coating, etc.

According to an embodiment, a spacer is disposed on the pixel-defining layer 119. The spacer prevents the organic light-emitting diode OLED from being damaged due to sagging of a mask used in a manufacturing process. The spacer is formed of an organic insulating material such as polyimide, polyamide, an acryl resin, benzocyclobutene, HMDSO, or a phenol resin, etc., by using a method such as spin coating, etc., and may have a single layer or a multi-layer structure.

According to an embodiment, the intermediate layer 220 is disposed on the portion of the pixel electrode 210 that is exposed by the pixel-defining layer 119. The intermediate layer 220 includes an emission layer (EML), and selectively further includes a functional layers such as a hole transport layer (HTL), a hole injection layer (HIL), an electron transport layer (ETL), and an electron injection layer (EIL), below and above the EML.

According to an embodiment, the EML includes an organic material that includes a fluorescent or phosphorescent material that emits red, green, blue, or white light. The EML includes a low molecular weight organic material or a polymer organic material.

According to an embodiment, when the EML includes a low molecular weight material, the intermediate layer 220 has a structure in which an HIL, an HTL, an EML, an ETL, an EIL, etc., are stacked in a single or composite structure, and the low molecular weight organic material includes various organic materials such as copper phthalocyanine (CuPc), N,N'-di(naphthalene-1-yl)-N,N'-diphenyl-benzidine (NPB), or tris(8-hydroxyquinolinato)aluminium (Alq3), etc. These layers are formed by vacuum deposition.

According to an embodiment, when the EML includes a polymer material, the intermediate layer 220 has a structure that includes an HTL and an EML. In this case, the HTL includes poly(3,4-ethylenedioxythiophene) (PEDOT), and the EML includes a polymer material such as a polyphenylenevinylene (PPV)-based material or a polyfluorene-based material. The EML may be formed by screen printing, inkjet printing, or laser induced thermal imaging, etc.

According to an embodiment, a plurality of pixel electrodes 210 are provided, and the intermediate layers 220 correspond to each pixel electrode 210. However, embodiments of the present disclosure are not limited thereto. In other embodiments, various modifications are possible in which the intermediate layer 220 includes an integrated layer disposed over the pixel electrodes 210. In an embodiment, the Intermediate layer 220 corresponds to each of the pixel electrodes 210, and the functional layer(s) other than the intermediate layer 220 are integrally formed over the pixel electrodes 210.

In a present embodiment, the organic light-emitting diodes OLEDs in each of the first pixel P1, the second pixel P2, and the third pixel P3 include emission layers that emit light of the same color. For example, the organic light-emitting diodes OLEDs in the first pixel P1, the second pixel P2, and the third pixel P3 emit blue light.

According to an embodiment, the opposite electrode 230 is disposed on the intermediate layer 220. The opposite electrode 230 entirely covers the intermediate layer 220. The opposite electrode 230 is disposed on the display area DA, and covers the entire surface of the display area DA. That is, the opposite electrode 230 is integrally formed to cover the plurality of pixels.

According to an embodiment, the opposite electrode 230 may be a transmissive electrode or a reflective electrode. In some embodiments, the opposite electrode 230 is a transparent or semi-transparent electrode, and is formed of a metallic thin film that has a low work function, and includes one or more of Li, Ca, LiF/Ca, LiF/Al, Al, Ag or Mg, or compounds thereof. In addition, a transparent conductive oxide (TCO) film such as ITO, IZO, ZnO, or $In_2O_3$ is further disposed on the metallic thin film.

According to an embodiment, when the pixel electrode 210 is a reflective electrode and the opposite electrode 230 is a transmissive electrode, light emitted from the intermediate layer 220 is emitted toward the opposite electrode 230, and thus, the display apparatus 1 is a top emission-type display apparatus. In another embodiment, when the pixel electrode 210 is a transparent or semi-transparent electrode and the opposite electrode 230 is a reflective electrode, the light emitted from the intermediate layer 220 is emitted toward the first substrate 100, and thus, the display apparatus 1 is a bottom emission-type display apparatus. However, embodiments of the present embodiment are not limited thereto, and the display apparatus 1 of a present embodiment may be a double-sided emission type that emits light in both top and bottom directions.

According to an embodiment, the thin-film encapsulation layer 400 is disposed on the opposite electrode 230 to protect the organic light-emitting diode OLED from external moisture and oxygen. The thin-film encapsulation layer 400 includes at least one organic encapsulation layer and at least one inorganic encapsulation layer.

According to an embodiment, the thin-film encapsulation layer 400 includes a first inorganic encapsulation layer 410, a second inorganic encapsulation layer 430 on the first inorganic encapsulation layer 410, and an organic encapsulation layer 420 between the first inorganic encapsulation layer 410 and the second inorganic encapsulation layer 430.

According to an embodiment, the first inorganic encapsulation layer 410 and the second inorganic encapsulation layer 430 include at least one inorganic material selected from aluminum oxide, titanium oxide, tantalum oxide, hafnium oxide, zinc oxide, silicon oxide, silicon nitride, or silicon oxynitride. The first inorganic encapsulation layer 410 and the second inorganic encapsulation layer 430 may have a single layer or multi-layer structure that includes the materials described above. The first inorganic encapsulation layer 410 and the second inorganic encapsulation layer 430 may include the same material or different materials.

According to an embodiment, the organic encapsulation layer 420 includes one of a monomer-based material or a polymer-based material. The organic encapsulation layer 420 includes at least one of polyethylene terephthalate, polyethylene naphthalate, polycarbonate, polyimide, polyethylene sulfonate, polyoxymethylene, polyarylate, hexamethyldisiloxane, or an acryl resin, such as polymethyl methacrylate or polyacrylic acid, etc., or any combination thereof.

Although cracks are generated in the thin-film encapsulation layer 400 through the multi-layer structure described above, the thin-film encapsulation layer 400 prevents the cracks from spreading between the first inorganic encapsulation layer 410 and the organic encapsulation layer 420 or between the organic encapsulation layer 420 and the second inorganic encapsulation layer 430. Accordingly, the formation of a passage through which external moisture or oxygen can permeates the display area DA may be prevented or minimized.

In a present embodiment, the color filter unit 20 faces the first substrate 100.

According to an embodiment, a filler 610 is further disposed between the display unit 10 and the color filter unit 20. The filler 610 acts as a buffer against external pressure, etc. The filler 610 is formed of an organic material such as methyl silicone, phenyl silicone, or polyimide, etc. However, embodiments of the present disclosure are not limited thereto, and other embodiments, the filler 610 is formed of an organic sealant such as a urethane-based resin, an epoxy-based resin, or an acryl-based resin, or an inorganic sealant such as silicon.

According to an embodiment, the color filter unit 20 of FIG. 7 has a configuration in which the color filter unit 20 of FIG. 4A is turned upside down. That is, the display apparatus 1 has a configuration in which the color filter unit 20 is manufactured on the second substrate 300 and then bonded to the display unit 10. Accordingly, with respect to the display apparatus 1, a side surface of the first partition 320 has a reverse-tapered shape.

According to an embodiment, the second inorganic insulating layer 323 is disposed on the filler 610, and the first color conversion pattern 331, the second color conversion pattern 332, the light transmission pattern 333, and the dummy color conversion pattern 334 are disposed on the second inorganic insulating layer 323 and spaced apart from each other.

According to an embodiment, the second substrate 300 is disposed on the first color conversion pattern 331, the second color conversion pattern 332, the light transmission pattern 333, and the dummy color conversion pattern 334. The first color filter 311 is disposed between the second substrate 300 and the first color conversion pattern 331, the second color filter 312 is disposed between the second substrate 300 and the second color conversion pattern 332, the third color filter 313 is disposed between the second substrate 300 and the light transmission pattern 333, and the dummy color filter 314 is disposed between the second substrate 300 and the dummy color conversion pattern 334.

According to an embodiment, the first partition 320 is disposed between the first color conversion pattern 331 and the second color conversion pattern 332, between the second color conversion pattern 332 and the light transmission pattern 333, and between the light transmission pattern 333 and the dummy color conversion pattern 334. The light-shielding member 301 is disposed between the second substrate 300 and the first partition 320 to correspond to the first partition 320 and the light transmission pattern.

According to an embodiment, with respect to the first pixel P1, blue incident light Lib emitted from the organic light-emitting diode OLED sequentially passes through the first color conversion pattern 331 and the first color filter 311. The blue Incident light Lib is converted into red light Lr while passing through the first color conversion pattern 331, and the converted red light Lr is transmitted by the first color filter 311.

According to an embodiment, an emission mechanism of the first pixel P1 also applies to the second pixel P2. The second pixel P2 converts the blue incident light Lib into green light Lg and transmits the converted green light Lg through the same mechanism as the first pixel P1.

According to an embodiment, with respect to the third pixel P3, blue incident light Lib emitted from the organic light-emitting diode OLED sequentially passes through the light transmission pattern 333 and the third color filter 313.

According to an embodiment, with respect to the dummy color conversion pattern 334 and the dummy color filter 314, the dummy color conversion pattern 334 and the dummy color filter 314 convert or transmit light of different colors, thereby preventing light from being emitted from the non-display area NDA.

Figure 8:
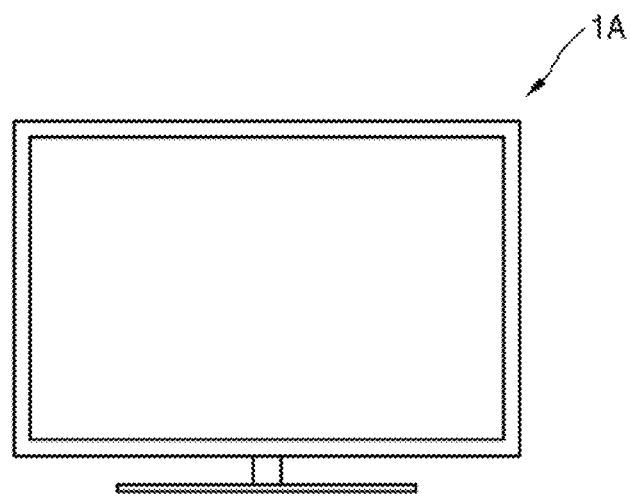
FIGS. 8 to 10 illustrate electronic devices into which a display apparatus according to an embodiment is incorporated.
Figure 9:
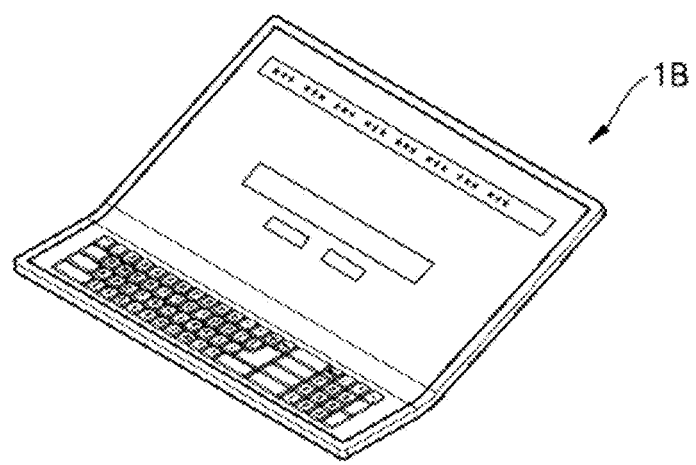
Figure 10:
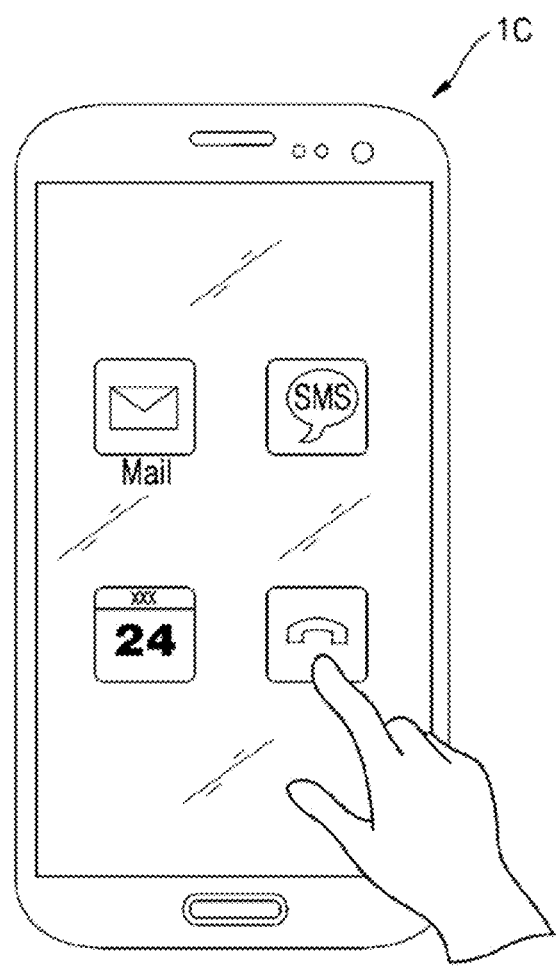

FIGS. 8 to 10 illustrate electronic devices into which a display apparatus according to an embodiment can be incorporated.

According to an embodiment, a display apparatus that has the structure described above may be a television 1A as shown in FIG. 8, a laptop computer or a foldable tablet PC 1B as shown in FIG. 9, or a portable display 1C such as a mobile phone as shown in FIG. 10. Alternatively, as incorporated into a display portion of an intelligent speaker, the structure of the display apparatus according to an embodiment of the disclosure is not limited.

Display apparatuses of the related art emit blue light from a dummy pattern disposed in a non-display area. According to an embodiment, a display apparatus is provided prevents light from being emitted from the non-display area and has improved product reliability, by using a color conversion pattern and a color filter that convert light of different colors and transmit the converted light.

a display apparatus has been mainly described above, but embodiments of the present disclosure are not limited thereto. For example, it will be understood that a method of manufacturing a display apparatus is also within the scope of an embodiment of the present disclosure.

According to an embodiment of the present disclosure, a display apparatus with improved light efficiency and color reproducibility is realized. However, the scope of embodiments of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a first substrate that includes a display area that includes a plurality of pixels and a non-display area around the display area;
a second substrate that faces the first substrate;
a color conversion layer disposed on the second substrate and that corresponds to the display area;
a color filter layer disposed between the second substrate and the color conversion layer;
a dummy color conversion pattern disposed on the second substrate and that corresponds to the non-display area, and that includes a same material as a portion of the color conversion layer; and
a dummy color filter disposed between the second substrate and the dummy color conversion pattern,
wherein the dummy color filter transmits a different color light from the light emitted from the dummy color conversion pattern.

2. The display apparatus of claim 1,
wherein the plurality of pixels comprise a first pixel, a second pixel, and a third pixel, and
wherein the color conversion layer comprises:
a first color conversion pattern that corresponds to the first pixel;
a second color conversion pattern that corresponds to the second pixel; and
a light transmission pattern that corresponds to the third pixel,
wherein the first color conversion pattern, the second color conversion pattern, the light transmission pattern, and the dummy color conversion pattern are spaced apart from each other.

3. The display apparatus of claim 2, wherein
the first color conversion pattern includes first quantum dots that convert incident light into first color light,
the second color conversion pattern includes second quantum dots that convert incident light into second color light, and
the light transmission pattern includes light-scattering particles that scatter incident light.

4. The display apparatus of claim 2,
wherein the dummy color conversion pattern includes a same material as the first color conversion pattern or the second color conversion pattern.

5. The display apparatus of claim 2, further comprising a first partition disposed between the first color conversion pattern and the second color conversion pattern, between the second color conversion pattern and the light transmission pattern, between the light transmission pattern and the dummy color conversion pattern, and in, the non-display area.

6. The display apparatus of claim 5, further comprising a second partition disposed on the first partition.

7. The display apparatus of claim 2, wherein the color filter layer comprises:
a first color filter disposed between the second substrate and the first color conversion pattern and that selectively transmits first color light,
a second color filter disposed between the second substrate and the second color conversion pattern and that selectively transmits second color light; and
a third color filter disposed between the second substrate and the light transmission pattern and that selectively transmits third color light.

8. The display apparatus of claim 7, wherein the dummy color filter includes a same material as the first color filter or the second color filter.

9. The display apparatus of claim 7, wherein the first color filter, the second color filter, and the third color filter are directly disposed on the second substrate.

10. The display apparatus of claim 7, further comprising a light-shielding member disposed between the second substrate and the first color filter, the second color filter, the light transmission pattern and the dummy color filter, wherein the light-shielding member comprises a same material as the third color filter.

11. The display apparatus of claim 7, further comprising a first inorganic insulating layer that extends between the first color filter and the first color conversion pattern, between the second color filter and the second color conversion pattern, and between the third color filter and the light transmission pattern.

12. A display apparatus comprising:
a first substrate that includes a display area and a non-display area around the display area, wherein the display area includes a first pixel, a second pixel, and a third pixel;
a second substrate that faces the first substrate;
a first color conversion pattern disposed on the second substrate and that corresponds to the first pixel;
a second color conversion pattern disposed on the second substrate and that Corresponds to the second pixel;
a light transmission pattern disposed on the second substrate and that corresponds to the third pixel;
a dummy color conversion pattern disposed on the second substrate and that corresponds to the non-display area and includes a same material as the first color conversion pattern or the second color conversion pattern;
a first color filter disposed between the second substrate and the first color conversion pattern;
a second color filter disposed between the second substrate and the second color conversion pattern;
a third color filter disposed between the second substrate and the light transmission pattern; and
a dummy color filter disposed between the second substrate and the dummy color conversion pattern,
wherein the dummy color filter transmits different color light from that emitted from the dummy color conversion pattern.

13. The display apparatus of claim 12, wherein the first color conversion pattern, the second color conversion pattern, the light transmission pattern and the dummy color conversion pattern are spaced apart from each other.

14. The display apparatus of claim 12, wherein
the first color conversion pattern includes first quantum dots that convert incident light into first color light,
the second color conversion pattern includes second quantum dots that convert incident light into second color light, and
the light transmission pattern includes light-scattering particles that scatter incident light.

15. The display apparatus of claim 2,
wherein when the dummy color conversion pattern includes the same material as the first color conversion pattern, the dummy color filter includes a same material as the second color filter, and
wherein, when the dummy color conversion pattern includes the same material as the second color conversion pattern, the dummy color filter includes a same material as the first color filter.

16. The display apparatus of claim 12, further comprising:
a first display element disposed on the first substrate and that corresponds to the first pixel;
a second display element disposed on the first substrate and that corresponds to the second pixel; and
a third display element disposed on the first substrate and that corresponds to the third pixel.

17. The display apparatus of claim 16, further comprising a thin-film encapsulation layer that covers the first display element, the second display element, and the third display element, and that includes at least one inorganic encapsulation layer and at least one organic encapsulation layer,
wherein the first color conversion pattern, the second color conversion pattern, and the light transmission pattern are disposed on the thin-film encapsulation layer.

18. A display apparatus comprising:
a first substrate that includes a display area that includes a plurality of pixels and a non-display area around the display area;
a second substrate that faces the first substrate;
a color conversion layer disposed on the second substrate and that corresponds to the display area and that includes a plurality of color conversion patterns;
a dummy color conversion pattern disposed on the second substrate and that corresponds to the non-display area; and
a dummy color filter disposed between the second substrate and the dummy color conversion pattern,
wherein the dummy color conversion pattern includes a same material as one of the plurality of color conversion patterns, and the dummy color filter transmits a different color light from the light emitted from the dummy color conversion pattern.

19. The display apparatus of claim 18, further comprising:
a color filter layer disposed between the second substrate and the color conversion layer,
wherein the plurality of pixels comprise a first pixel, a second pixel, and a third pixel,
wherein the plurality of color conversion patterns comprise:
a first color conversion pattern that corresponds to the first pixel,
a second color conversion pattern that corresponds to the second pixel, and
a light transmission pattern that corresponds to the third pixel, and wherein the color filter layer comprises:
a first color filter disposed between the second substrate and the first color conversion pattern;
a second color filter disposed between the second substrate and the second color conversion pattern; and
a third color filter disposed between the second substrate and the light transmission pattern.

* * * * *